United States Patent [19]
Yoshida et al.

[11] Patent Number: 5,952,061
[45] Date of Patent: Sep. 14, 1999

[54] FABRICATION AND METHOD OF PRODUCING SILICON FILMS

[75] Inventors: Makoto Yoshida; Takahiro Saida, both of Ibaraki; Satoshi Okada, Kanagawa; Masahiro Akamatsu, Ibaraki; Kenichi Kondo, Tokyo, all of Japan

[73] Assignee: Stanley Electric Co., Ltd., Tokyo, Japan

[21] Appl. No.: 08/996,197

[22] Filed: Dec. 22, 1997

[30] Foreign Application Priority Data

Dec. 27, 1996 [JP] Japan ................................ 8-349926

[51] Int. Cl.$^6$ ........................................... C23C 16/24
[52] U.S. Cl. ...................... 427/580; 427/585; 427/588; 204/192.38
[58] Field of Search .................... 427/578, 580, 427/585, 588, 452; 204/192.38

[56] References Cited

U.S. PATENT DOCUMENTS 4,505,947  3/1985  Vukanovic et al. ..................... 427/568
4,929,322  5/1990  Sue et al. ............................... 427/580

FOREIGN PATENT DOCUMENTS 3208086  9/1983  Germany.
59-144120  8/1984  Japan.
63-463  1/1988  Japan.
1-184273  7/1989  Japan.
5-202467  8/1993  Japan.

*Primary Examiner*—Timothy Meeks
*Attorney, Agent, or Firm*—Morgan, Lewis & Bockius LLP

[57] ABSTRACT

The present invention is an apparatus and method for the fabrication of high quality silicon films by deposition of a silicon vapor onto a substrate. The silicon film fabrication apparatus includes a chamber, a crucible having an anode for melting a silicon metal, an anode for generating a DC arc discharge plasma, a substrate holder facing the crucible, and a heater for heating a substrate arranged in the substrate holder. The apparatus also includes a variable DC power supply, a cathode element including an electrode plate for generating the DC arc discharge plasma, a gas intake pipe penetrating through the electrode plate into the chamber, and an exhaust pipe having a valve facing the gas intake pipe. The silicon film is fabricated by disposing a substrate in a chamber, introducing hydrogen gas into the chamber, generating the DC arc discharge plasma, evaporating the silicon metal in the chamber, and depositing the silicon vapor on the substrate after the vapor passes through the DC arc discharge plasma.

8 Claims, 8 Drawing Sheets

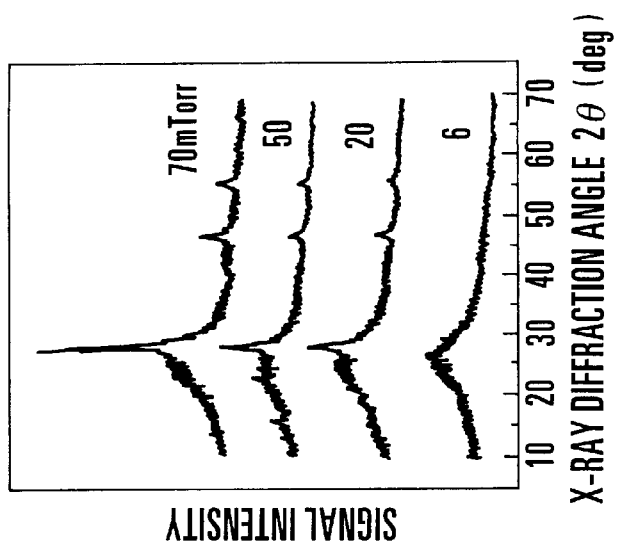
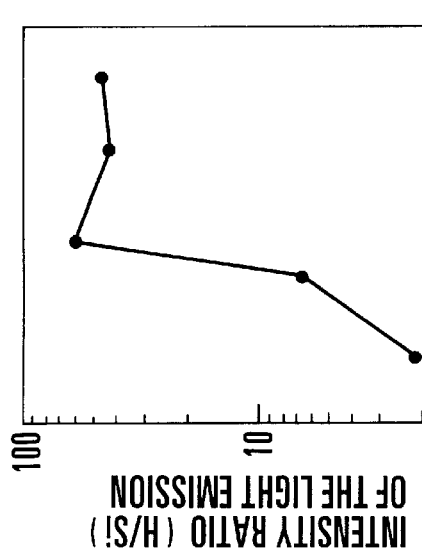
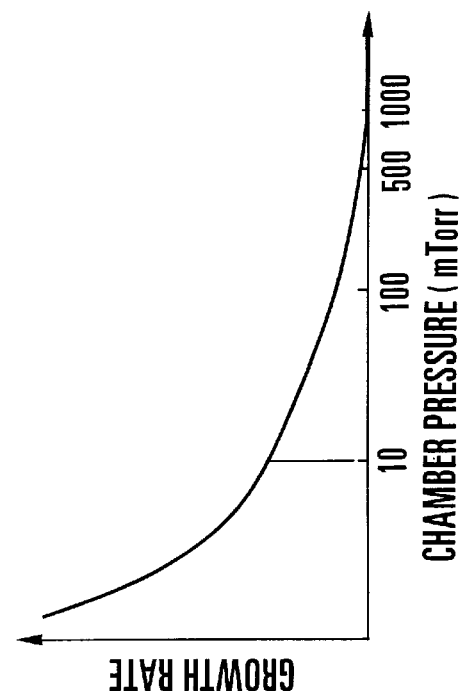
FIG.7(A)
FIG.7(B)
FIG.7(C)

FABRICATION AND METHOD OF PRODUCING SILICON FILMS

This invention claims the benefit of Application No. HEI 08-349926 filed on Dec. 27, 1996, which is hereby incorporated by reference.

BACKGROUND OF THE INVENTION

1. Field of the Invention

The present invention relates to a silicon film and a method for making the same, and more particularly, to a semiconductor silicon film formed by deposition and utilizing solid silicon as a raw material, and its fabrication method.

2. Discussion of the Related Art

A silicon film has been used in the fabrication of thin film solar cells and the like. A conventional silicon thin film solar cell comprises a hydrogenated amorphous silicon film (a-Si:H) fabricated by a chemical vapor deposition (CVD) process onto a glass substrate. A problem with such amorphous silicon solar cells is a gradual decrease in efficiency upon prolonged exposure to light. An attempt to solve this problem involves a high temperature heat treatment to crystallize the a-Si:H films. An additional drawback of the CVD process is its utilization of silane gas which is volatile and increases the risk of fire.

Electronic beam deposition is an easier method of fabricating a silicon film, wherein an electronic beam gun evaporates solid silicon and the silicon vapor is deposited onto a substrate. However, silicon films obtained by this method contain many dangling bonds that deteriorate its semiconductor properties and are inferior to the silicon films obtained by the CVD process. Hydrogen atoms have been effective to terminate the dangling bonds and decrease their occurrence.

FIG. 8 illustrates schematically a conventional apparatus used in an electronic beam deposition method. The apparatus includes an exhaustible vacuum chamber 51, an evaporation source 53 including an electronic beam gun, a heater 60, a substrate 61 being heated by the heater 60, an ion gun 55 for supplying hydrogen ions in the chamber 51, and an exhaust pipe 57. The air in the chamber is pumped out through the exhaust pipe 57 such that the chamber 51 exhibits a vacuum to a predetermined degree. The electronic beam, generated by the electronic beam gun and directed to the evaporation source 53, evaporates a raw silicon material, while hydrogen ions are generated by hydrogen gas produced by the ion gun 55. The silicon vapor, produced by the evaporation source 53, and the hydrogen gas, from the ion gun 55, reach the substrate 61 at substantially the same time and combine to form an a-Si:H film. Hydrogen ions effectively decrease the density of the dangling bonds in the a-Si:H films from a density on the order of $10^{20} cm^{-3}$ without any hydrogen ions to $3 \times 10^{17} cm^{-3}$ with hydrogen ions.

While the deposition method improves the properties of the silicon films by utilizing hydrogen ions, it limits the speed of forming an a-Si:H film because of the insufficient current density of the hydrogen ions. In a conventional ion gun, hydrogen ionizes and an electrical grid conducts the generated ions to produce and conduct current through the chamber 51. A space charge limits the ion current and makes it difficult to produce a large ion current.

SUMMARY OF THE INVENTION

The present invention is directed to a silicon film and its manufacture that substantially obviates one or more of the above problems due to the limitations and disadvantages of the related art.

An object of the invention is to provide a high quality silicon film with improved semiconductor properties.

Another object of the invention is to provide a method to produce a large ion current in the chamber thereby substantially improving the speed of forming a silicon film.

A further object of the invention is to provide an apparatus to fabricate a high quality silicon film according to the method of the present invention.

According to the present invention, the above objects are achieved by utilizing a fabrication method for producing a silicon film including the steps of arrangement of a substrate, generating a DC arc discharge plasma after introducing hydrogen gas into a chamber, evaporating silicon metals, and depositing the silicon vapor activated by the hydrogen arc plasma onto the substrate.

According to the present invention, a second fabrication method for producing silicon film includes the steps of arrangement of a substrate, generating a first DC arc discharge plasma after introducing at least one inert gas into the chamber, forming a second DC arc discharge plasma by introducing hydrogen gas into the chamber after stabilizing the first DC arc discharge plasma, evaporating silicon metals, and depositing the silicon vapor, activated by the second DC arc discharge plasma, onto the substrate.

Polycrystalline silicon films can be obtained when the above described fabrication processes are performed at a chamber pressure of approximately 10–500 mTorr. According to the present invention, whether a polycrystalline silicon film or an amorphous silicon film is fabricated depends on the number of activated hydrogen ions, the production of which is controlled by the chamber pressure.

It is to be understood that both the foregoing detailed description and the following general description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 7(A) is a graph depicting a relationship between the chamber pressure and the intensity ratio (H/Si) of the light emission wave length over the range from H to the light emission wavelength of 634.7 nm, obtained from the vapor silicon, according to the third preferred embodiment of the present invention;

FIG. 7(B) depicts the x-ray diffraction patterns of the films deposited at the pressures of 6, 20, 50 and 70 mTorr, respectively, according to the third preferred embodiment of the present invention;

FIG. 7(C) depicts a relationship between the growth rate of the silicon film and the chamber pressure according to the third preferred embodiment of the present invention.

DETAILED DESCRIPTION OF THE PREFERRED EMBODIMENTS

The present invention will be described in detail by referring to the accompanying drawings that illustrate preferred embodiments of the invention.

Figure 1A:
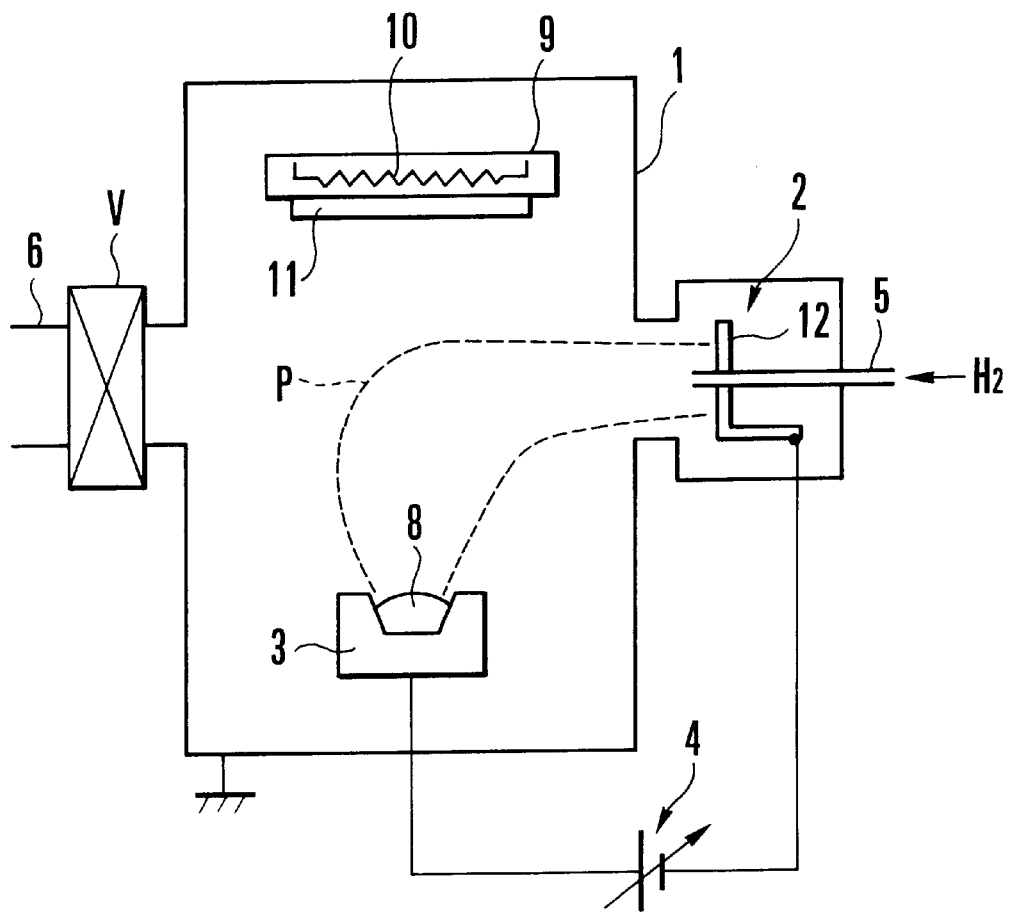
FIG. 1(A) is a diagram of an apparatus for fabricating a silicon film according to the first preferred embodiment of the present invention.

FIG. 1(A) is a diagram of an apparatus for fabricating a silicon film according to the first preferred embodiment of the present invention. The apparatus for fabricating a silicon film includes a cathode 2 further including an electrode plate 12 and a gas intake pipe 5 penetrating through the electrode plate 12, a variable DC power supply 4, an exhaust pipe 6 with a valve V facing the gas intake pipe 5, and a chamber 1 including a crucible 3, for melting a silicon metal 8, combined with an anode, and a substrate holder 9 including a heater 10. A substrate 11, formed of glass or the like, is arranged in the substrate holder 9 opposite to the crucible 3 and is heated by a heater 10.

An electrode plate 12 of the cathode 2 is connected to a variable DC power supply 4 which is insulated from the chamber 1. The electrode plate 12, formed of Ta and LaB$_6$ materials, is penetrated by the pipe 5 for introducing a hydrogen gas into the grounded chamber 1.

A DC arc plasma is then generated by maintaining the hydrogen gas pressure uniformly throughout chamber 1 during the deposition of the silicon vapor upon the substrate by maintaining a hydrogen gas flow rate, introduced by the gas intake pipe 5, and a pumping rate of the exhausting pipe 6, respectively, at predetermined values. A voltage, generally several hundred volts, is applied between the anode 3 and the cathode 2 by the operation of the variable DC power supply 4. When a discharge begins in a hydrogen atmosphere, positive hydrogen ions and electrons are produced and they are accelerated towards the cathode 2 and anode 3, respectively. Collisions of the positive ions with the cathode 2 heats the electrode 12 and thus, thermal electrons are generated by the cathode 2.

Generation of the thermal electrons causes plasma density to increase resulting in a glow discharge changing into an arc discharge as the voltage between the anode 3 and the cathode 2 decreases. A constant current power supply may be preferably employed for the variable DC power supply 4.

Figure 1B:
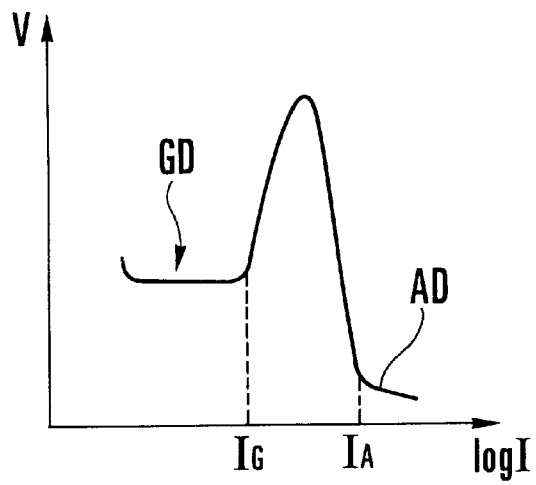
FIG. 1(B) is a graph depicting a relationship between a current conducted from an anode to a cathode with respect to the discharge voltage.

FIG. 1(B) graphically illustrates the discharge voltage behavior as a function of the current between the anode and the cathode. A plasma state is divided into three regions: a glow discharge region indicated as GD for current levels below $I_G$, an intermediate region between current levels $I_G$ and $I_A$, and an arc discharge region indicated as AD for current levels above $I_A$. Since the $I_A$ is larger by a hundred times than $I_G$, it is presumed that activated hydrogen exists in the AD region with a hundred times greater density than in the GD region.

Furthermore, an electron has a lower temperature in the AD region than in the GD region, because the discharge voltage in the AD region is typically 100 V, which is smaller than the discharge voltage in the GD region. The electron temperature in the AD region is suitable for activating the silicon vapor, because the temperature is close to the ionization energy of the silicon atoms, whereas the temperature in the GD region is too large for silicon vapor activation. To obtain high quality silicon films, the electrons are required to have a temperature in a range approximately from 0.1–10 eV with a density from approximately $5 \times 10^{11}$–$10^{14}$ cm$^{-3}$.

When the discharge voltage reaches the levels associated with the AD region, light is emitted from a large area in the chamber 1 and intense light is emitted from the area indicated by P in FIG. 1(A). The light intensity is greater in area P because the plasma has a higher intensity in the P area than in other areas.

The following reactions occur in the plasma;

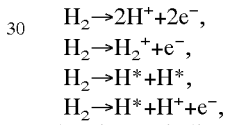

wherein H* indicates a hydrogen radical. Numerous electrons in the plasma collide with the silicon metal 8, on the anode 3, producing heat that evaporates the silicon 8. The silicon vapor passes through the plasma and arrives at the surface of the substrate 11. While the evaporated silicon atoms (or silicon clusters) passes through the plasma, the silicon vapor collides with the electrons, and with the activated hydrogen ions and radicals. The activated hydrogen gas and the silicon vapor arrive almost simultaneously at the surface of the substrate 11 and forms a silicon film.

The operational advantages this fabrication method of producing a silicon film, according to the preferred embodiment of the present invention, will now be described. First, high quality silicon films can be obtained since the DC plasma generates high density activated hydrogen and the activated Si is sufficiently accelerated to move toward the substrate. Secondly, higher ion current can be generated since the plasma is not restricted by the space charge. Thirdly, the resulting DC arc plasma has a large number of activated hydrogen ions and radicals. In comparison with the glow discharge plasma, the arc discharge plasma has a large number of particles that have sufficient energy for film deposition and few particles with excessively high energy that are capable of degrading the quality of the film. The use of activated high density hydrogen improves the quality and deposition rate of the silicon films. Lastly, activated silicon vapor passed through the arc discharge plasma also improves the quality of the silicon films.

Figure 1C:
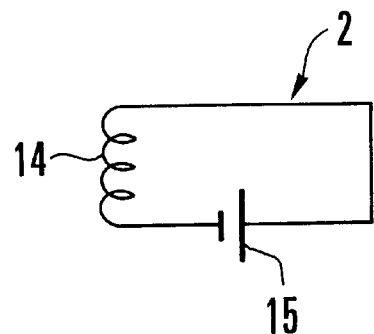
FIG. 1(C) depicts a diagram of a cathode element configuration according to the second preferred embodiment of the present invention.

FIG. 1(C) corresponds to the cathode 2 in FIG. 1(A) and represents another example of a cathode configuration including a heating filament 14 and a DC power supply 15. In this configuration the arc discharge can be obtained by applying any voltage in the AD region, of FIG. 1(B), to the filament 14.

Figure 2A:
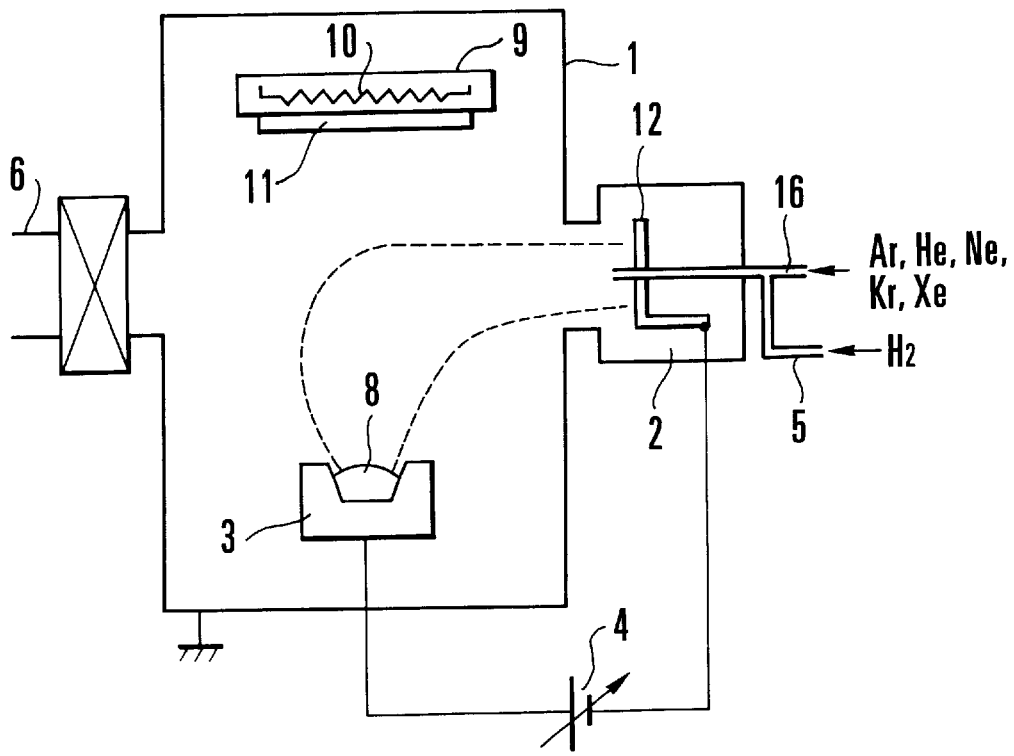
FIG. 2(A) depicts a cross sectional view of a fabrication apparatus for the introduction of hydrogen gas with Ar gas, or other inert gases, according to the third preferred embodiment of the present invention.

Furthermore, an inert gas, such as He, Ne, Ar, Kr, Xe, etc., may be added to the materials to generate the arc discharge plasma in addition to hydrogen in the configuration of the apparatus as indicated in FIGS. 2(A) and (B). FIG. 2(A) illustrates a cross sectional view of a fabrication apparatus wherein hydrogen gas is introduced along with Ar gas, or some other inert gases, according to the third preferred embodiment of the present invention. The apparatus includes gas intake pipes 5 and 16 for introducing hydrogen gas and Ar gas, respectively, into the chamber 1. The gas intake pipe 5 and 16 share a common passageway for introducing gas into chamber 1. The Ar gas is introduced through the gas intake pipe 16 into the common passageway into the chamber 1 and the first arc discharge plasma occurs in the chamber 1 filled with the Ar atmosphere alone. After stabilizing the Ar plasma, the hydrogen gas is introduced through the gas intake pipe 5 and into the common passageway and the second arc discharge plasma occurs in the chamber 1.

Figure 2B:
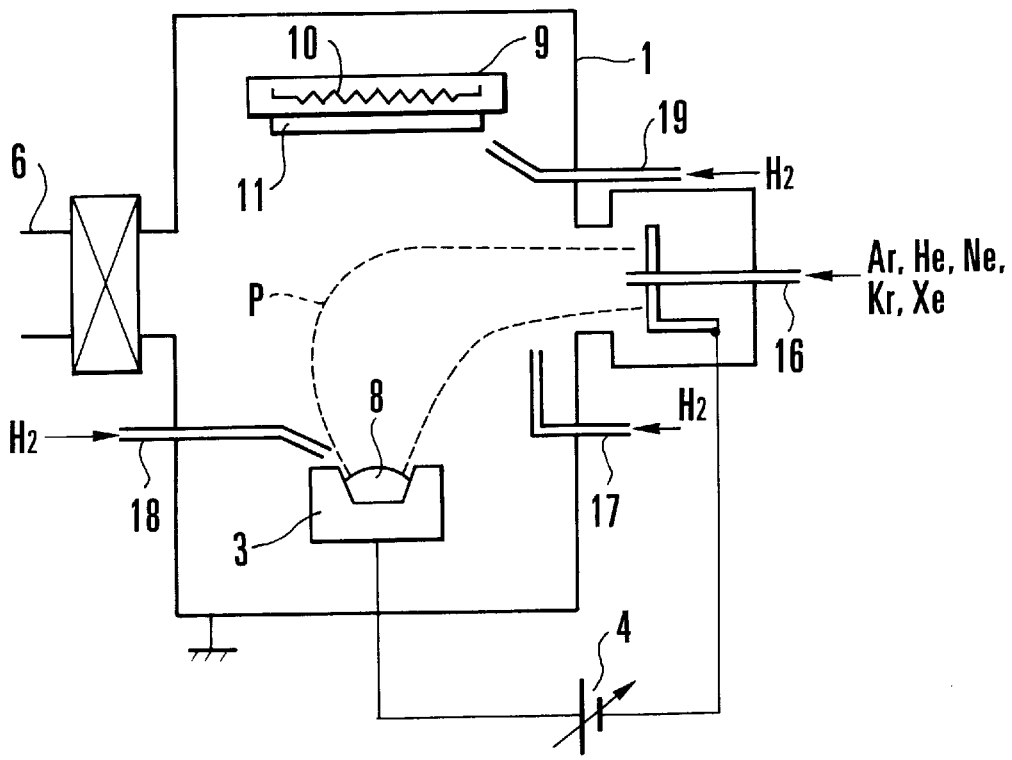
FIG. 2(B) depicts a cross sectional view of the fabrication apparatus in accordance with the fourth to sixth preferred embodiments of the present invention, showing multiple positions of the hydrogen gas intake pipe in addition to the position depicted in FIG. 2(A)

Instead of the gas intake pipe 5 in FIG. 2(A), the hydrogen intake pipe may have other alternate configurations as illustrated in FIG. 2(B), such as a gas intake pipe 17 directing $H_2$ gas towards the high density plasma area P, a gas intake pipe 18 directing $H_2$ gas towards the melted silicon 8, and a gas intake pipe 19 directing $H_2$ gas towards the substrate 11. In a preferred embodiment the chamber 1, as illustrated in FIG. 2(B), includes only intake pipes 17, 18, or 19, although the chamber 1 may be constructed with any combination of intake pipes 17, 18, or 19. The silicon films obtained by one of the apparatuses of FIG. 2(B) include less oxygen than the silicon films obtained by the apparatus of FIG. 2(A).

Figure 3:
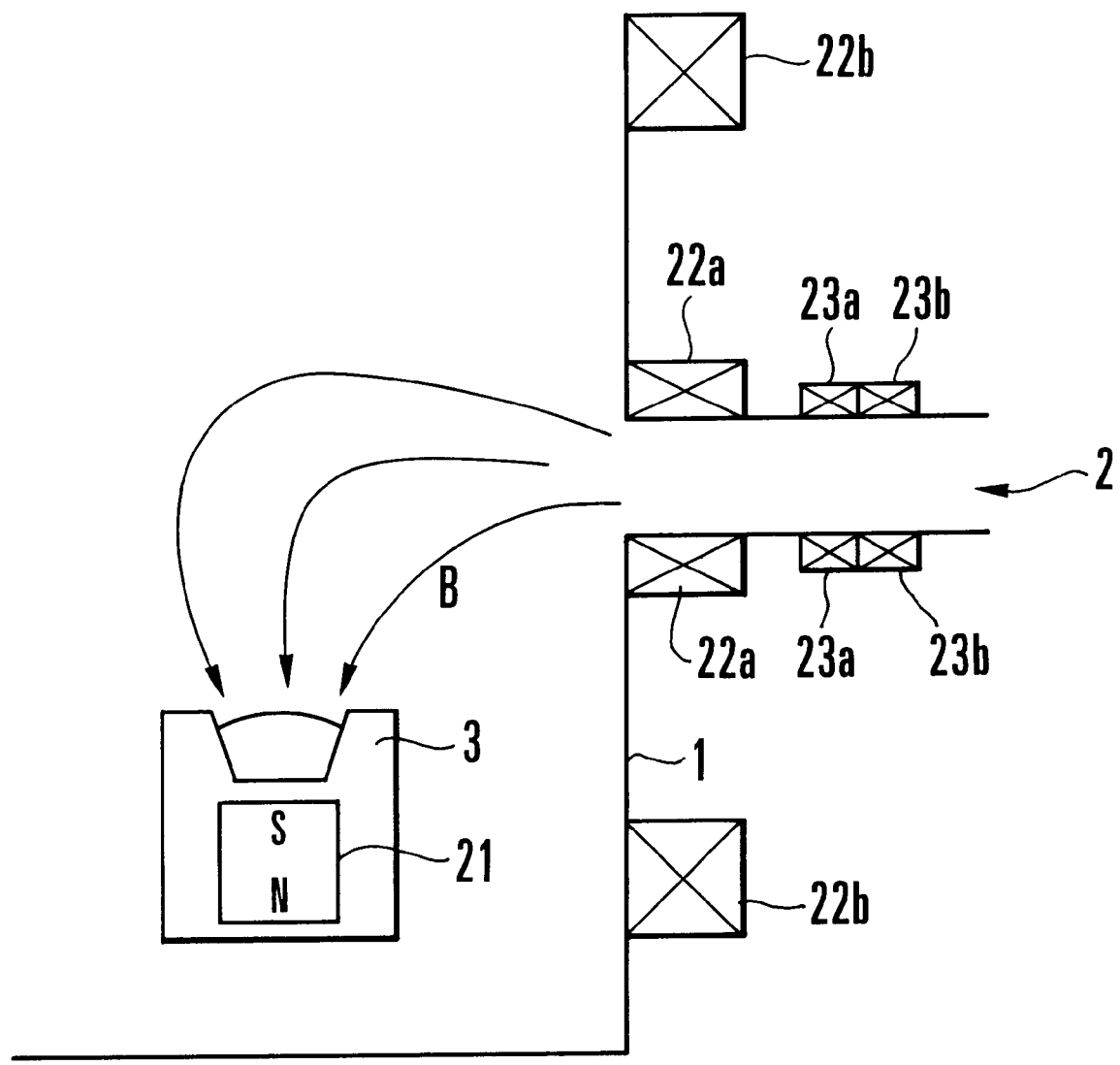
FIG. 3 depicts a fabrication apparatus utilizing magnets to produce a magnetic field according to the seventh preferred embodiment of the present invention.

A magnetic field can be applied to the plasma, to create a pinch effect, to stabilize the plasma. FIG. 3 depicts an apparatus utilizing magnets according to the seventh preferred embodiment of the invention to create such a pinch effect. The apparatus includes a permanent magnet 21, disposed in the anode 3, electromagnets 22a, 22b, 23a, and 23b are disposed around the cathode 2 on the surface of the chamber 1. The electromagnets form magnetic fields whose shapes and intensities change depending on the applied current. A preferred magnetic field is obtained by adjusting the applied current. Other configurations of magnets are also possible and yield similar improved results.

Figure 4A:
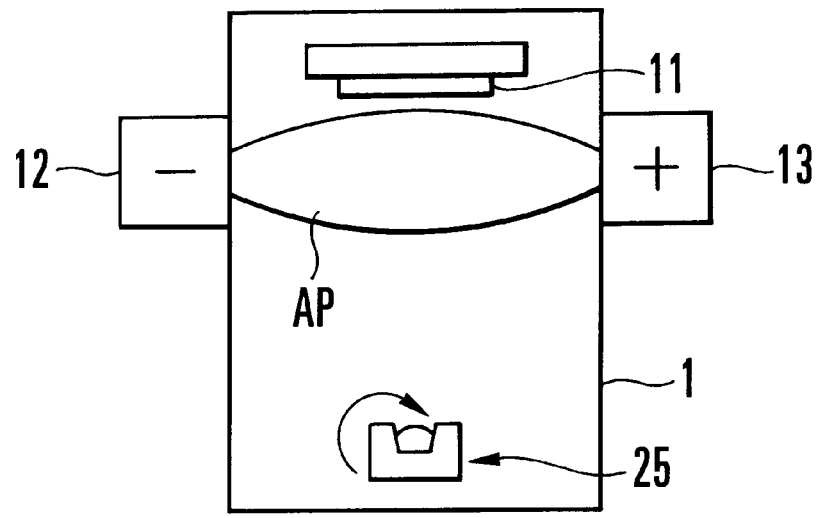
FIG. 4(A) depicts a fabrication apparatus according to the eighth preferred embodiment of the present invention.

In addition to the above evaporation method, wherein the silicon metal 8 is evaporated by the heat generated by the electrons in the plasma, evaporation methods may be available. As illustrated in FIG. 4(A), an evaporation source 25 with an electronic beam gun is disposed near the bottom of the chamber 1 and the substrate 11 is placed above the evaporation source 25. The arc discharge plasma occurs between the cathode 12 and the anode 13 and is substantially parallel to and is disposed beneath the surface of the substrate 11. The silicon atoms evaporated from the evaporation source 25 are activated by and pass through the plasma and reach the substrate 11. The configuration has an advantage in that the plasma density and the evaporation rate of the silicon can be controlled separately.

Figure 4B:
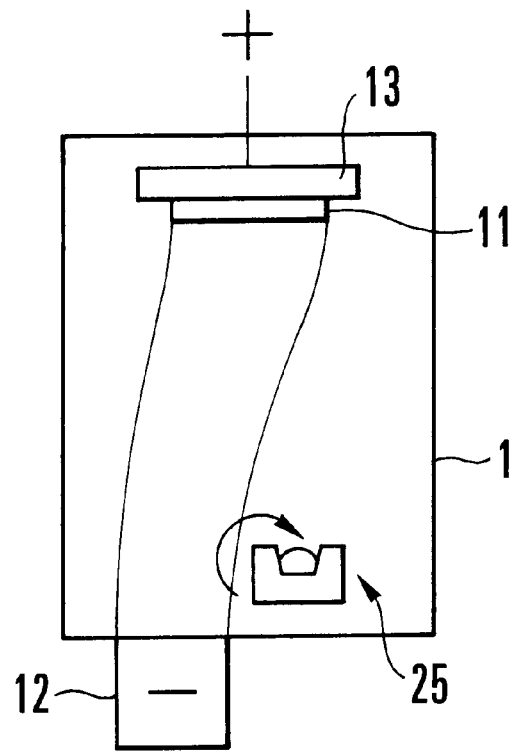
FIG. 4(B) depicts a fabrication apparatus according to the ninth preferred embodiment of the present invention.

As illustrated in FIG. 4(B), the anode 13 is combined with the substrate holder 11 and the cathode 12, facing towards the anode 13, is located near the evaporation source 25 on the bottom of the chamber 1. This configuration has a further advantage, in addition to the configuration shown in FIG. 4(A), that a path of the plasma, between the cathode 12 and the anode 13, overlaps the flow of the silicon vapor from the evaporation source 25 to the substrate 11. In a preferred embodiment the path of the plasma substantially overlaps the flow of the silicon vapor from the evaporation source 25 to the substrate 11.

The conditions of the silicon deposition utilizing the apparatus illustrated FIG. 1 (A) are as follow:

| cathode current | 100 A |
| cathode voltage | 100 V |
| hydrogen flow rate | 120 sccm |
| argon flow rate | 10 sccm |
| pressure | $7 \times 10^{-4}$ Torr |
| substrate temperature | 400° C. |

Figure 8:
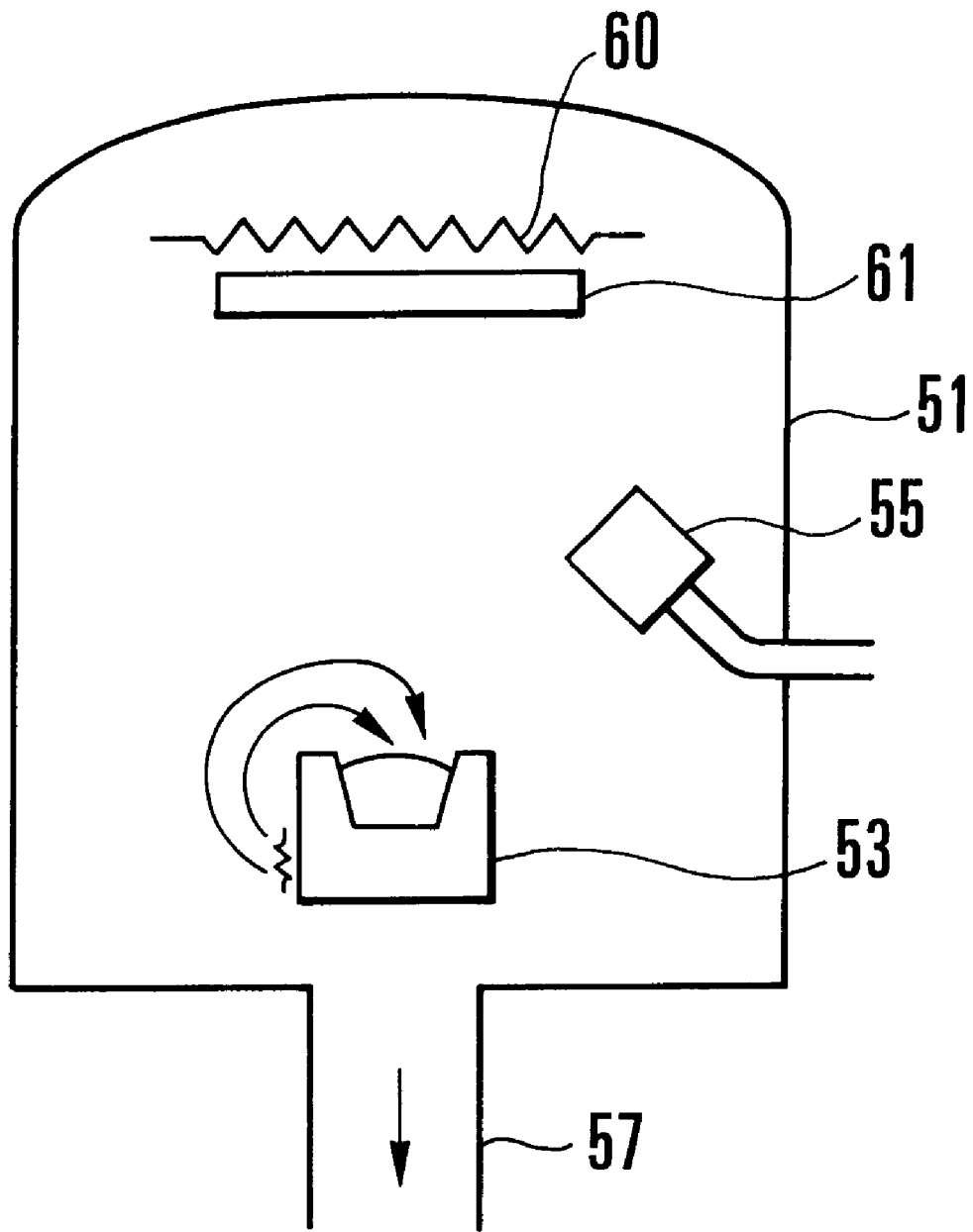
FIG. 8 depicts a diagram of a conventional fabrication apparatus.

The above conditions result in a silicon film having a dangling bond density of $3 \times 10^{16} cm^{-3}$ at the growth rate of 10 nm/s. In spite of the higher growth rate, as compared with a conventional electronic beam deposition method as shown in FIG. 8 which is three times higher, the dangling bond density is about ten times lower than silicon films grown by the conventional electronic beam deposition method. The above results illustrate that the deposition of the silicon films using the DC arc discharge plasma is suitable for the fabrication of the high quality silicon films at a high growth rate. The high plasma density and the appropriate electron energy for ionization of the silicon atoms in the arc discharge plasma clearly improve the quality of the silicon films.

The deposition for polycrystalline silicon (poly-Si) films obtained by the apparatus illustrated in FIG. 2(A) will now be described. The typical conditions for forming the poly-Si films are as follows:

| cathode current | 200 A |
| cathode voltage | 100 V |
| hydrogen gas flow rate | 120 sccm |
| argon gas flow rate | 30 sccm |
| pressure | $7.5 \times 10^{-2}$ Torr |
| substrate temperature | 300~500° C. |

Figure 5:
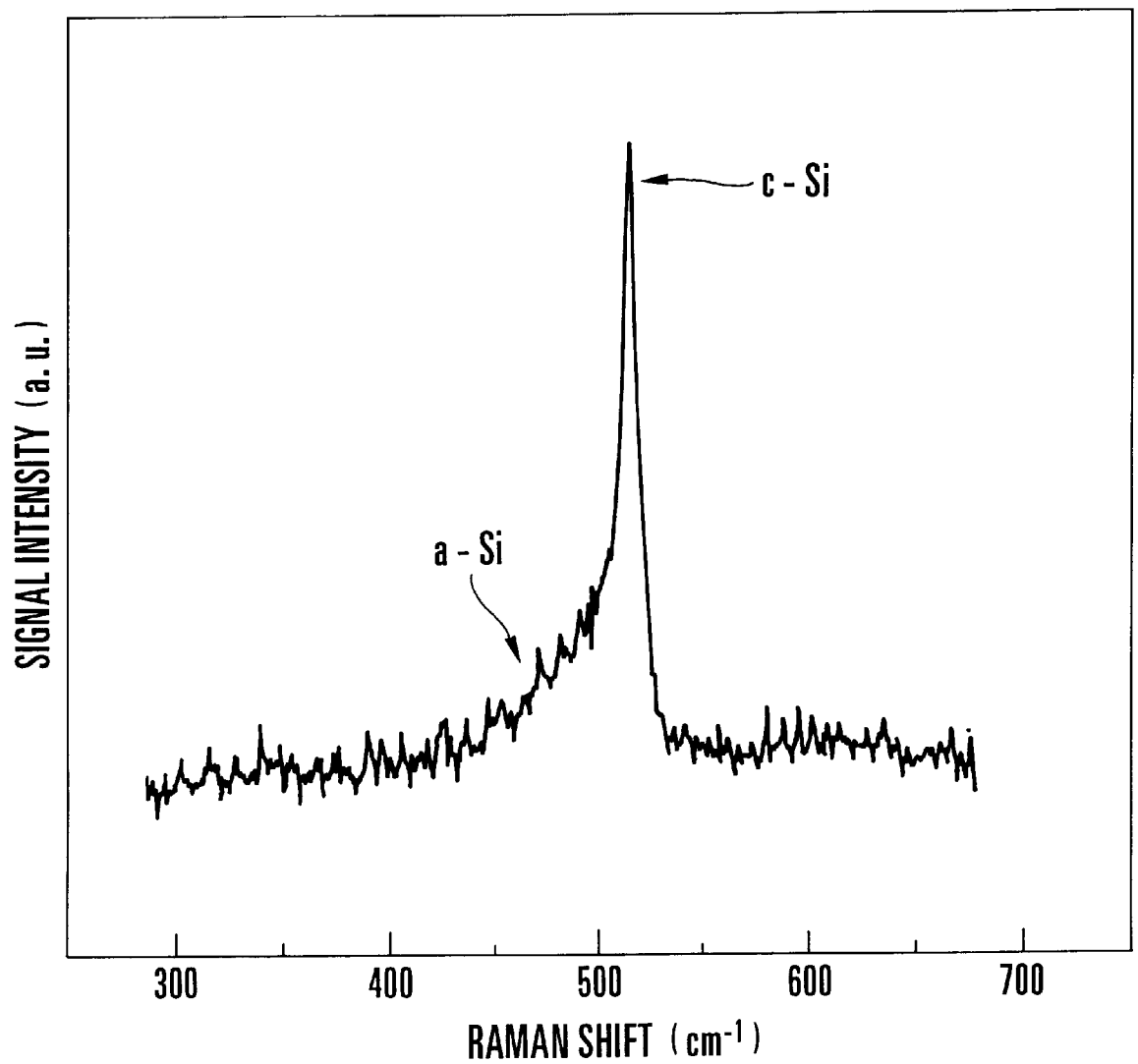
FIG. 5 depicts a Raman spectrum of a silicon film obtained by utilizing an apparatus according to the third preferred embodiment of the present invention.
Figure 6:
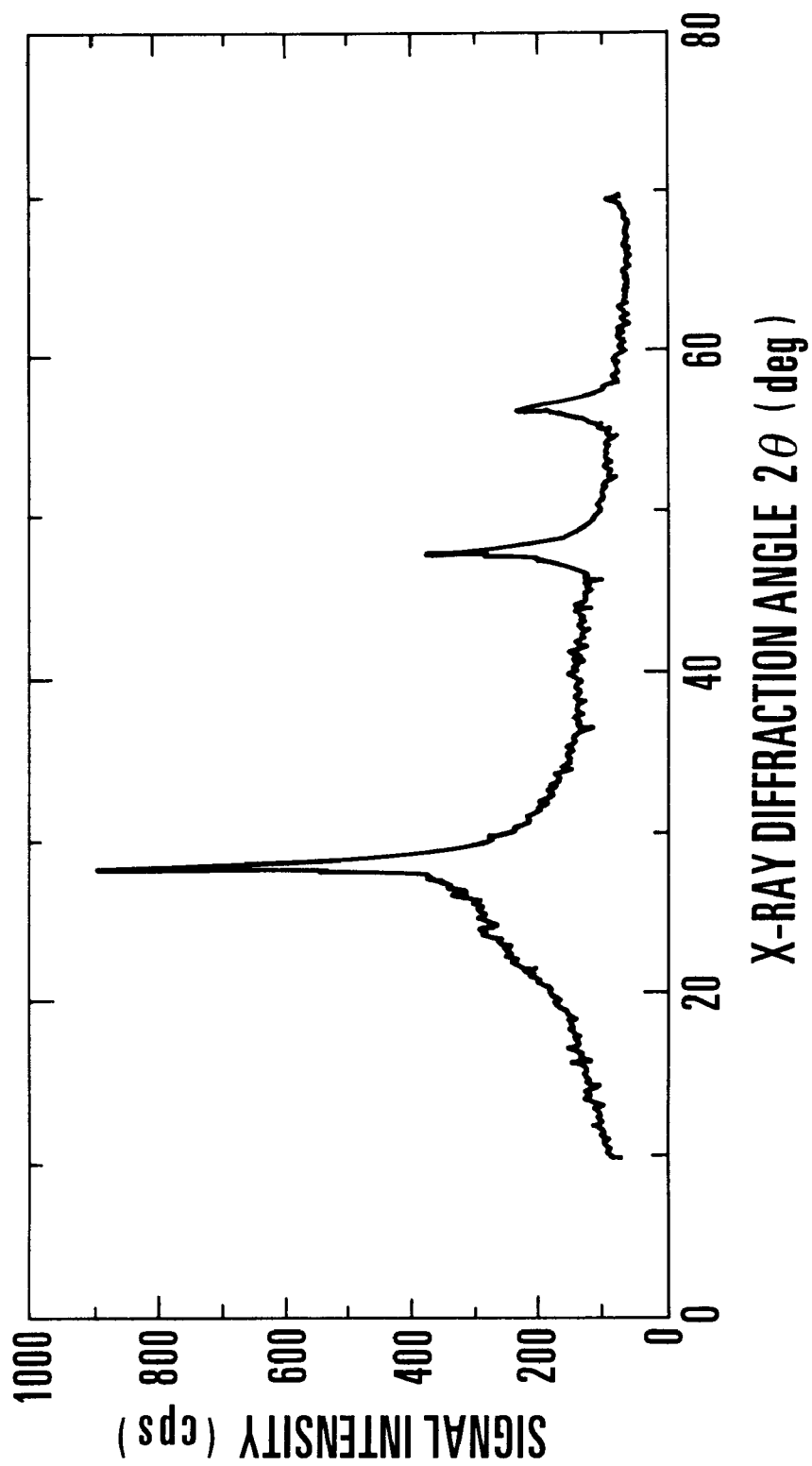
FIG. 6 depicts an x-ray diffraction pattern of a silicon film obtained by utilizing an apparatus according to the third preferred embodiment of the present invention.

The Raman spectrum, depicted in FIG. 5, and the x-ray diffraction pattern, depicted in FIG. 6, indicate that polycrystalline silicon films are obtained. To fabricate high quality poly-Si films it is very important to maintain an appropriate ratio between the silicon evaporation rate and the number of activated hydrogen ions.

FIG. 7(A) depicts the pressure dependence on the intensity ratio (H/Si) of the light emission from H of 657 nm wavelength to the light emission wavelength of 634.7 nm from the vapor silicon, generated, respectively, by the arc plasma during the deposition according to the third preferred embodiment of the present invention. In the range of 8~20 mTorr, the H/Si ratio increases with increasing pressure, whereas, above 20 mTorr, it is substantially stable. This result suggests that the ratio of the evaporation rate to the number of activated hydrogen atoms increases with increasing pressure in the range of 8~20 mTorr and above 20 mTorr the ratio is stable.

FIG. 7(B) represents the x-ray diffraction patterns of the films deposited at the pressures of 6, 20, 50, and 70 mTorr, respectively, according to the third preferred embodiment of the present invention. At the pressure of 6 mTorr the film spectrum displays no peaks, which represent the formation of a silicon crystal. At the pressures above 20 mTorr the peaks are observed which represent silicon film formation. Therefore, the graph indicates that the poly-Si films are formed at pressures of 10 mTorr and above.

The graph of FIG. 7(C) depicts a relationship between the growth rate of the silicon films and the pressure in the chamber according to the third preferred embodiment of the present invention. The growth rate decreases as the pressure increases and becomes zero at pressures above 500 mTorr. This behavior indicates that the electrons in the plasma do not have enough energy for evaporating the silicon when they must also traverse the distance around the crucible. This is due to the fact that more electron energy is consumed in the collisions with the larger amount of gas, which is comprised of at least hydrogen, as the pressure increases.

Therefore, a chamber pressure above 10 mTorr is required for fabrication of the poly-Si films and preferably a pressure below 500 mTorr is required for silicon deposition at a suitable growth rate. While a chamber pressure range from 10 to 500 mTorr is suitable for the deposition of the poly-Si films, a pressure range from approximately 20 to 500 mTorr is better for the fabrication of high quality films. It should be noted that silicon films can be obtained, due to the high silicon evaporation rate relative to the number of the activated hydrogen ions, at pressures below 10 mTorr. It is possible to fabricate both polycrystalline and amorphous silicon films depending on the number of the activated hydrogen ions, which is controlled by the pressure in the chamber.

It will be apparent to those skilled in the art that various modifications and variations can be made in the fabrication of silicon films of the present invention without departing from the spirit or scope of the invention. It is intended that the present invention cover the modifications and variations of this invention provided they come within the scope and spirit of the appended claims and their equivalents.

What is claimed is:

1. A silicon film fabrication method comprising the steps of:
   disposing a substrate in a chamber;
   evacuating the chamber;
   introducing a hydrogen gas into the chamber;
   generating a DC arc discharge plasma;
   evaporating a silicon metal in the chamber;
   maintaining the chamber at a pressure in the range of 10~500 mTorr; and
   depositing a silicon vapor onto the substrate, thereby generating a polycrystalline silicon film.

2. The silicon film fabrication method according to claim 1, further comprising the steps of:
   generating the silicon vapor from a crucible containing a silicon raw material; and
   depositing the silicon vapor, which has passed through the DC arc discharge plasma, onto the substrate.

3. The silicon film fabrication method according to claim 1, further comprising the step of:
   generating the DC arc discharge plasma having an electron temperature of 0.1~10 eV with a density of $5 \times 10^{11} \sim 5 \times 10^{14} cm^{-3}$.

4. The silicon film fabrication method of claim 1, further comprising the step of:
   generating the DC arc discharge in an atmosphere, at least including hydrogen, introduced into the chamber.

5. The silicon film fabrication method according to claim 1, further comprising the step of:
   generating the DC arc discharge plasma in an atmosphere, at least including hydrogen and an inert gas, introduced into the chamber.

6. A silicon film fabrication method comprising the steps of:
   disposing a substrate in a chamber;
   evacuating the chamber;
   introducing inert gas into the chamber;
   generating a first DC arc discharge plasma by applying a DC voltage between an anode and a cathode;
   introducing hydrogen gas into the chamber after stabilizing the first DC arc discharge plasma;
   generating a second DC arc discharge plasma;
   evaporating a silicon metal in the chamber;
   maintaining the chamber at a pressure in the range of 10~500 mTorr; and
   depositing a silicon vapor, which passes through the second DC arc discharge plasma, onto the substrate thereby generating a polycrystalline silicon film.

7. The silicon film fabrication method according to claim 6, further comprising the step of:
   pumping hydrogen gas into the chamber around the cathode; and
   generating the DC arc discharge plasma between the cathode and the anode in the hydrogen gas atmosphere.

8. The silicon film fabrication method according to claim 6, further comprising the step of:
   pumping hydrogen gas and an inert gas into the chamber around the cathode; and
   generating the DC arc discharge plasma between the cathode and the anode in the hydrogen and an inert gas atmosphere.

* * * * *